(12) United States Patent
Nagaishi et al.

(10) Patent No.: US 6,794,961 B2
(45) Date of Patent: Sep. 21, 2004

(54) HIGH FREQUENCY CIRCUIT MODULE

(75) Inventors: Hideyuki Nagaishi, Hachioji (JP); Hiroshi Kondoh, Fuchu (JP)

(73) Assignee: Hitachi, Ltd., Tokyo (JP)

( * ) Notice: Subject to any disclaimer, the term of this patent is extended or adjusted under 35 U.S.C. 154(b) by 71 days.

(21) Appl. No.: 10/067,917

(22) Filed: Feb. 8, 2002

(65) Prior Publication Data

US 2003/0080836 A1 May 1, 2003

(30) Foreign Application Priority Data

Oct. 25, 2001 (JP) ........................................ 2001-327225

(51) Int. Cl.[7] .............................................. H01P 1/00
(52) U.S. Cl. ..................... 333/247; 333/24 C
(58) Field of Search .............................. 333/247, 24 C; 343/700 MS

(56) References Cited

U.S. PATENT DOCUMENTS

| | | | | |
|---|---|---|---|---|
| 5,521,406 A | * | 5/1996 | Tserng et al. ................ | 257/276 |
| 5,832,598 A | * | 11/1998 | Greenman et al. ............ | 29/840 |
| 6,188,368 B1 | * | 2/2001 | Koriyama et al. .......... | 343/767 |
| 6,249,242 B1 | * | 6/2001 | Sekine et al. ................. | 342/70 |
| 6,320,547 B1 | * | 11/2001 | Fathy et al. ......... | 343/700 MS |

FOREIGN PATENT DOCUMENTS

| | | |
|---|---|---|
| FR | 2 710 195 | 9/1993 |
| JP | 04000802 | 4/1990 |
| JP | 8-250913 | 3/1995 |
| JP | 9-237867 | 2/1996 |
| WO | WO 99/62135 | 5/1999 |

OTHER PUBLICATIONS

European Search Report dated Dec. 8, 2003.

* cited by examiner

*Primary Examiner*—Robert Pascal
*Assistant Examiner*—Kimberly Glenn
(74) *Attorney, Agent, or Firm*—Reed Smith LLP; Stanley P. Fisher, Esq.; Juan Carlos A. Marquez, Esq.

(57) ABSTRACT

A high frequency circuit module for use in an automotive radar or the like, in which RF circuit parts are mounted on both sides of a hard multilayer dielectric substrate, and a transmission line connecting the RF circuit parts provided on both sides is constructed by a via group including a periodical structure or a via having a coaxial structure perpendicular to faces of the multilayer dielectric substrate. As the multilayer dielectric substrate, a hard multilayer substrate using metallic layers as a microstrip line wiring layer, a DC/IF signal line layer, and grounding metal layers for shielding which are disposed on and under the DC/IF signal line is employed. By using the transmission line achieved by a through via having the periodical structure or the through via having the coaxial structure, an electromagnetic wave propagating in parallel between the grounding conductors is confined.

9 Claims, 9 Drawing Sheets

HIGH FREQUENCY CIRCUIT MODULE

BACKGROUND OF THE INVENTION

1. Field of the Invention

The present invention relates to a high frequency circuit module and, more specifically, to a high frequency circuit module in which a high frequency circuit part such as a monolithic microwave integrated circuit (hereinbelow, called an MMIC) and an antenna are provided on the surface and the rear face, respectively, of a multilayer dielectric substrate. More particularly, the invention relates to a high frequency circuit module suitable for an automotive radar module using millimeter waves.

2. Description of the Related Arts

As the most effective system of an intelligent transport system (ITS) solving a traffic accident, traffic jam, environmental problems of exhaust gas, noise, and so one, resource problems due to large consumption of oil energy, and the like caused by "vehicles", a millimeter wave radar has been developed. In order to equip vehicles as many as possible with millimeter wave radars, realization of an automotive radar module having improved flexibility of a vehicle mounting layout by reducing the size and thickness of the millimeter wave radar, reliability, and low cost is demanded.

As a high frequency circuit module adapted to the automotive radar, a high frequency circuit module in which an antenna and an MMIC are provided on the surface and rear face, respectively, of a multilayer dielectric substrate having therein metallic layers is known For example, as shown in FIG. 10 (conventional technique 1), on the surface and rear face of a ceramic multilayer substrate 38 in which a plurality of metallic layers 30 to 33 are provided, an antenna 28 and an MMIC 29 are provided, respectively. As high frequency transmission lines between the antenna 28 and the MMIC 29, microstrip lines 34 and 35 and electro-magnetic coupling slots 36 and 37 are used. Techniques using electro-magnetic coupling slots of this kind are disclosed in Japanese Unexamined Patent Application Nos. 9-237867 and 8-250913. In this example of mounting, when a slot having the same structure is formed over a slot to make the transmission line length shortest, a microstrip line having a length of around $\lambda/2$ remains between the slots and works as a resonator. However, when electro-magnetic coupling slots are provided above and below the microstrip line, a potential difference occurs between the upper and lower slot metallic layers. Consequently, an electromagnetic wave which propagates in parallel between the slot metallic layers is generated. An amount corresponding to the energy of the electromagnetic wave becomes a loss, so that it difficult to realize the transmission line of a low loss. Therefore, by setting the distance between the electro-magnetic coupling slots to $\lambda/2$ or longer, interference between the slots is prevented and a loss in the transfer line is minimized. Due to such a structure, the mounting method using the electro-magnetic coupling slots needs a mounting area having the distance of $2\lambda$ or longer between the slots, and layout of the upper and lower electronic parts has to be considered so as not to cause interference with the transfer mode of the slot coupling part.

As shown in FIG. 11A (conventional technique 2), there is a known technique in which connection between a plurality of conductive layers 31 and 33 in the multilayer dielectric substrate 38 having the plurality of conductive layers 30 to 33 and 39 is realized by a via satisfying the condition of $(R \cdot r)/(2 \cdot h) \leq L \leq (5 \cdot R \cdot r)/h$ (where R, r, and L denote sizes shown in FIG. 11C and h denotes the distance between the conductive layers). When a signal to be transmitted is in a millimeter wave band, the connection between conductive layers in the multilayer substrate formed by the via satisfying the condition can be made by a connecting method of a low loss only in the case where there is one grounding layer connected to the via. However, occurrence of an electromagnetic wave propagating between a plurality of grounding layers cannot be suppressed. Consequently, the method cannot be used to connect the conductors to realize a low loss in the millimeter wave band.

Further, as a technique which does not use a dielectric multilayer substrate, as shown in FIG. 12 (conventional technique 3), there is a technique in which an MMIC 43 and an antenna 44 are provided on the surface and rear face, respectively, of a metal base plate 42, and a coaxial structure 45 formed in the base plate 42 is used to connection the MMIC 43 and antenna 44. In the structure, the RF circuit substrate including the MMIC 43 and the antenna are connected to each other via the coaxial structure, so that a thin, small millimeter wave radar can be relatively easily produced. In the diagram, reference numerals 46, 47, 48, 49, 50 and 51 denote a circuit substrate, an insulating material, an outer terminal, an insulating material, a bonding wire, and a transmission/reception circuit cover, respectively.

As described above, the conventional techniques have problems with respect to easiness in manufacture, manufacturing cost, and circuit characteristics. Particularly, to use the modules for an automotive millimeter wave radar, since the millimeter wave radar is a device mounted outside of a vehicle and use environments of temperature, moisture, vibration, and the like are hostile, generally, an RF circuit has a hermetic structure of interrupting the outside air. Since the transmission loss in the millimeter wave band is much larger as compared with that in a microwave band, the transmission line has to be designed to be as short as possible. Although the line length can be shortened by mounting the RF circuit part on the same face of the substrate as the antenna, it is difficult to mount the RF circuit part and the antenna on the same face due to the limited size of the RF circuit part and the hermetic structure.

In order to mount the RF circuit part and the antenna of the millimeter wave radar as close as possible, the RF circuit part and the antenna are mounted on both sides of the mounting substrate so as to be overlapped, and an oscillator and an amplifier of the RF circuit parts have to be disposed so that the transmission line length becomes the shortest. However, as the mounting substrate of the millimeter wave band, a thin substrate having a dielectric thickness of 0.2 mm or less is used to suppress a transmission line radiation loss. Therefore, the base plate 42 for assuring the mechanical strength is needed as shown in FIG. 12 for the millimeter wave radar. Consequently, the structure whose assembling and processing cost is high has to be employed.

A both-sided two-layer substrate is generally used to assure the characteristics of the millimeter wave transmission line for an RF circuit. A transmission line for a millimeter signal, a power providing line, and a transmission line for a low frequency signal are formed on the same face. Since the high/low frequency signal transmission lines and the power providing line cannot cross each other, aerial wiring such as a bonding wire is required. The higher the frequency of a signal is, the more the signal easily radiates, and it causes a crosstalk in another line. It makes the millimeter waver radar unstable. In addition, since the flexibility of designing of layout of the RF circuit is regulated in the two-layer substrate, reduction in cost by reducing the substrate area of the expensive RF circuit part is limited.

SUMMARY OF THE INVENTION

An object of the invention is therefore to realize a high frequency circuit module in which high frequency circuit parts such as MMICs for millimeter waves and microwave and a plane antenna are mounted on a multilayer dielectric substrate and a loss of energy of electromagnetic waves is reduced, and which can be realized at low cost and, further, to provide a small, thin, and light automotive radar module with high design flexibility.

To achieve the object, there is provided a high frequency circuit (hereinbelow, called an RF circuit) module, wherein RF circuit parts are mounted on both sides of a multilayer dielectric substrate, and transmission lines connecting the RF circuit parts on both sides are constructed by a group of vias having a periodical structure or vias having a coaxial structure extended in the direction perpendicular to the face of the multilayer dielectric substrate.

The via group having the periodical structure is constructed so that a plurality of vias are distributed around a center conductor at a predetermined interval. Particularly, the interval is equal to or smaller than ¼ of wavelength of a signal of the transmission line. The via having the coaxial structure is formed by a center conductor and a cylindrical conductor surrounding the center conductor and connected to a grounding conductive layer provided in the multilayer dielectric substrate.

In a preferred embodiment of the invention, in an RF circuit module of an automotive radar module using millimeter waves, RF circuit parts on one of the faces of the hard multilayer dielectric substrate are MMICs such as an oscillator and an RF circuit part on the other face is an antenna. The invention is not limited to an automotive radar module but can be applied to an RF circuit module using microwaves and millimeter waves in which RF circuit parts are mounted on both sides of a hard multilayer dielectric substrate.

According to the invention, a millimeter wave transmission line extending vertically to a layer with a small transmission loss is provided in a hard multilayer dielectric substrate, and a metal layer for a DC/IF signal is shielded by grounding metal layers in the substrate. With the configuration, crosstalk to a DC/IF signal of a millimeter wave signal is lessened, the area occupied by the RF circuits can be reduced by multilayer wiring of the RF circuit, and resistance to distortion and destruction by a mechanical stress moment of the multilayer substrate is improved. Further, the surface of the multilayer dielectric substrate is flat and the assembling work is easily made by one-side reflowing, so that a small, thin, and low-cost RF circuit module can be realized. Particularly, the invention is effective to realize an automotive radar module having excellent cost efficiency and resistance to vibration, which is requested to have high performance.

DESCRIPTION OF THE PREFERRED EMBODIMENTS

Figure 1:
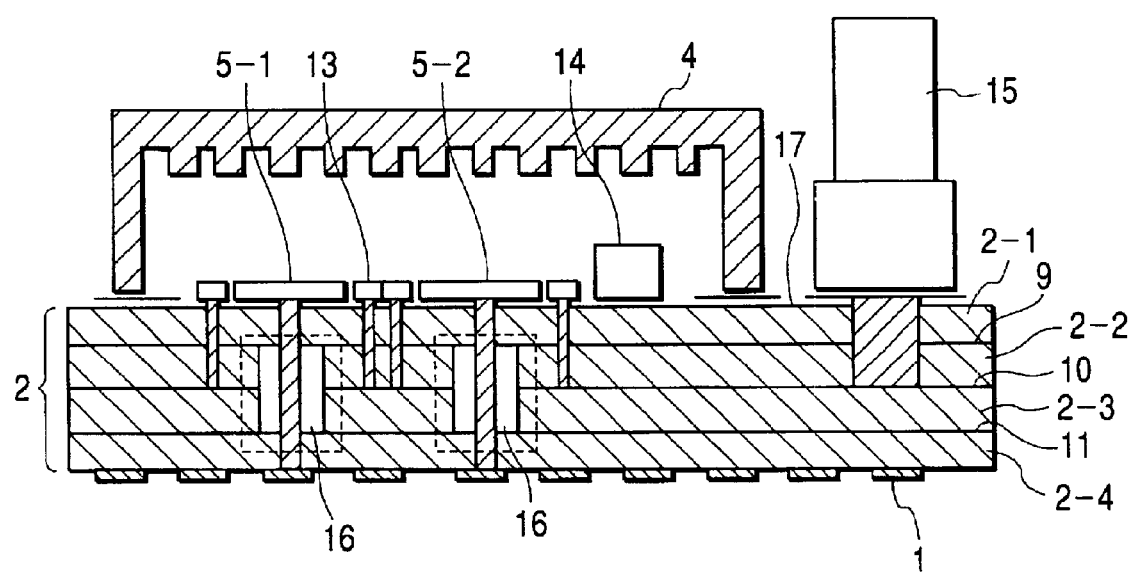
FIG. 1 is a sectional side view showing a first embodiment of an RF circuit module according to the invention.

FIG. 1 is a sectional side view showing the configuration of an example of an RF circuit module according to the invention. In the embodiment, as will be described hereinlater, the RF circuit module is used for an automotive radar using a millimeter wave.

In a hard multilayer dielectric substrate 2 of the embodiment, four hard dielectric layers 2-1, 2-2, 2-3, and 2-4 are formed, metallic layers 9, 10, and 11 are formed on the layers 2-2, 2-3, and 2-4, respectively, and a metallic pattern 17 is formed on the top face of the layer 2-1. By the metallic pattern 17, hard dielectric layer 2-1, and metallic layer 9, a transmission line such as a microstrip line is formed. The metallic layer 10 constructs a power providing line and a low frequency signal transmission line, and the metallic line 11 is used as a grounding metallic layer. On the surface of the hard dielectric layer 2-1, RF circuit parts 5-1 and 5-2 such as MMICs are mounted. On the outer face (rear face) of the dielectric layer 2-4, a metallic pattern 1 for forming an antenna as one of the RF circuit parts is formed.

Between the RF circuit parts 5 and the metallic pattern 1, a millimeter wave transmission line 16 extending perpendicular to the face of the multilayer dielectric substrate 2 is formed as a coupling transmission line. The millimeter wave transmission line 16 takes the form of a transmission line using a through via having a periodical structure or a through via having a coaxial structure which will be described hereinlater and transmits a millimeter wave signal between the metallic pattern 1 of the antenna and the RF circuit parts 5. The metallic pattern 1 of the antenna is processed so as to be adapted to the shape of a millimeter wave transmission via in the rear face of the RF circuit module.

On the top face of the multilayer dielectric substrate 2, not only the plurality of MMICs 5-1 and 5-2 but also other RF circuit parts such as a mono layer capacitor 13, a chip part 14, and a metallic pattern constructing a microstrip line are mounted. The RF circuit parts are hermetically sealed with a hermetic cap 4, thereby forming an RF circuit module. An input/output connector 15 is provided on the outside of the hermetic cap 4 and on the top face of the multilayer dielectric substrate 2.

The hermetic cap 4 is made of a metal or an insulator which is metal plated. The hermetic cap 4 and the hard multilayer dielectric substrate 2 are air-tightly sealed with an eutectic solder or the like to suppress deterioration in the temperature and moisture environments of the millimeter wave RF circuit constructed by the millimeter wave MMIC 5 and the like. Since the higher the electromagnetic wave is, the more it easily radiates to the air, particularly to avoid crosstalk in the millimeter wave RF circuit, a wave absorber whose electromagnetic wave absorption amount is 10 dB or more or a projected structure having a projection cycle of λ/2 is provided on the inner face of the hermetic cap 4.

The millimeter wave MMIC 5 is bare-chip bonded or flip-chip bonded to the surface of the hard multilayer dielectric substrate 2. In the case of the bare chip mounting, since the circuit face is in the surface layer, wire bonding can be used for a transmission line of an electric signal.

Figure 2A:
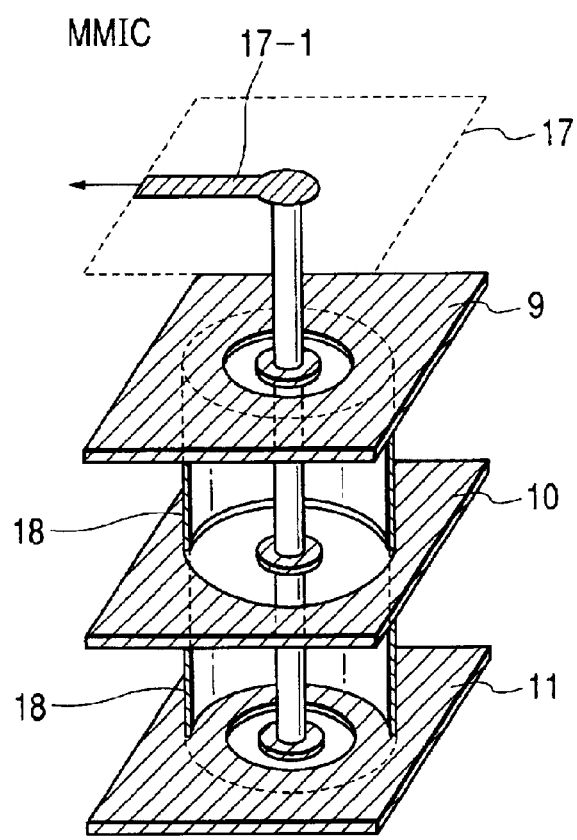
FIGS. 2A and 2B are diagrams for explaining the first embodiment of a millimeter wave transmission line extending vertically to a layer in a multilayer dielectric substrate.
Figure 2B:
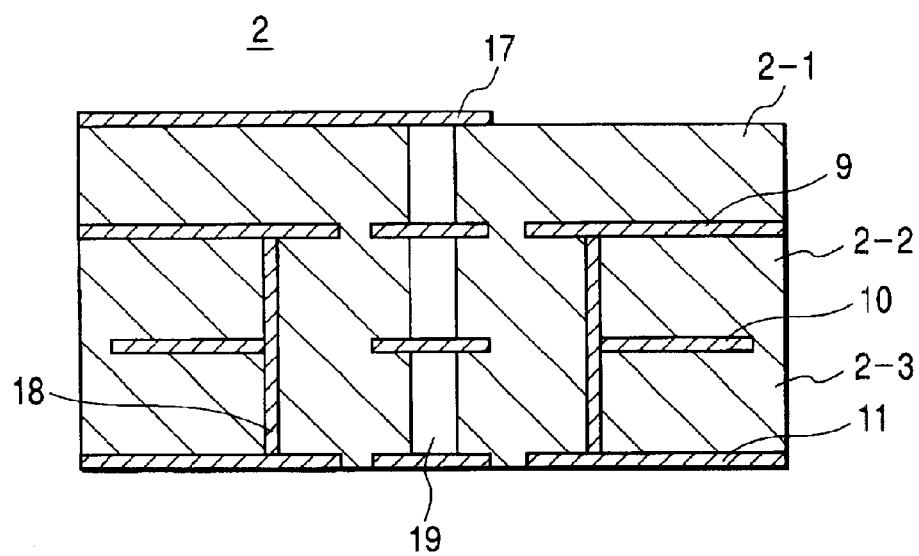

FIGS. 2A and 2B are diagrams for explaining the configuration of an example of the millimeter wave transmission line (hereinbelow, also called a vertical transmission line) 16 formed in the direction perpendicular to the face of the multilayer dielectric substrate 2 in FIG. 1. FIGS. 2A and 2B are perspective view and a partial cross section, respectively, of the vertical transmission line 16. Each layer is shown in a square shape for simplicity but actually has a wide width. In the uppermost layer 17, a metallic pattern 17-1 is formed by the surface metallic layer and connected to the MMIC (not shown). A microstrip transmission line is formed by the metallic pattern 17-1, the grounding metallic layer 9 as a counter electrode, and the dielectric substrate 2-1 provided between the pattern 17-1 and the layer 9.

The metallic layer 10 is a metallic pattern of a DC (direct current)/IF (intermediate frequency) signal line, and the metallic layer 11 is a metallic pattern for shielding the DC/IF signal line. A cylindrical metallic pattern 18 is used to connect the grounding metal layers 9 and 10 to each other. The cylindrical metallic pattern 18 and a center conductor 19 construct a via having the coaxial structure.

The coaxial structure is formed by sintering the multilayer dielectric substrate 2, irradiating the rear face of the metallic layer 11 with a laser beam to form a hole reaching the metallic layer 9 and after that, performing gold plated filling. The via 19 serving as a central conductor and the land pattern 17 in the surface layer are larger than the land patterns of the metallic layers 9 to 11. A land less pattern of the metallic layers 9 to 11 is designed to be ¼ of the wavelength or less, and a land less pattern of the metallic layer 10 is designed to be the outer diameter size in the case where the characteristic impedance of the coaxial structure is almost equal to that of the transmission line 17-1 in the surface layer, thereby realizing the via having the coaxial structure by which a low transmission loss is obtained.

Figure 3A:
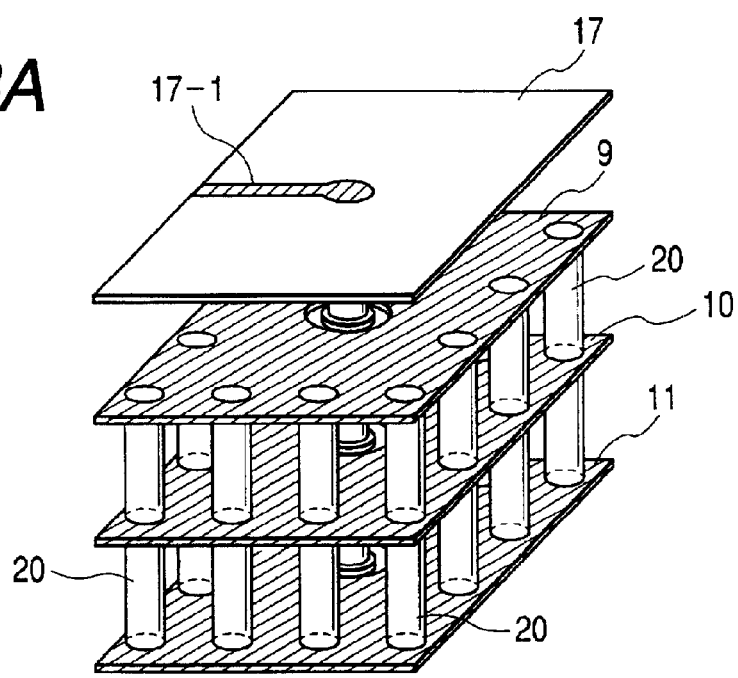
FIG. 3 is a diagram for explaining a second embodiment of the millimeter wave transmission line extending vertically to a layer in a multilayer dielectric substrate.
Figure 3B:
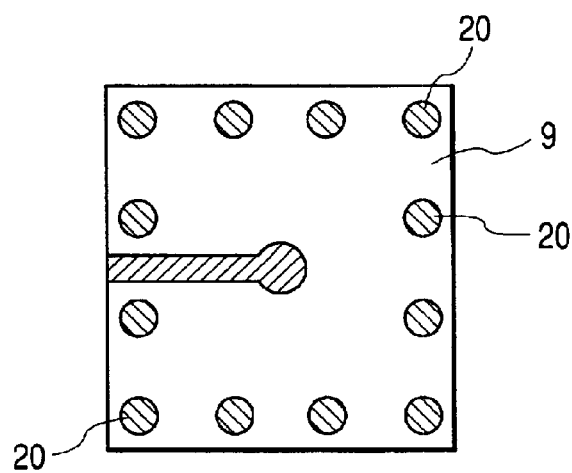
Figure 3C:
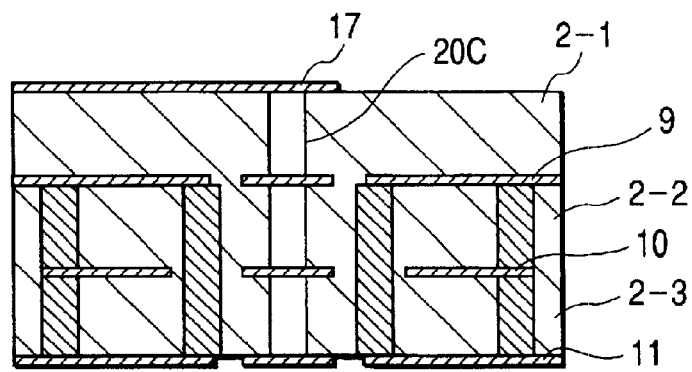

FIGS. 3A, 3B, and 3C are diagrams for explaining the configuration of another example of the millimeter wave transmission line 16 extended vertically to the layers. FIGS. 3A and 3B are a perspective view and a cross section, respectively, of the vertical transmission line 16. FIG. 3B is a plan view of one layer. In the uppermost layer 17, the metallic pattern 17-1 made by the surface metallic layer is formed and connected to the MMIC (not shown). The functions of the uppermost layer 17, metallic pattern 9 of the grounding metallic layer, and metallic patterns 10 and 11 in which the DC/IF signal line is formed are the same as those of the parts designated by the same reference numerals in FIGS. 2A and 2B.

Figure 4A:
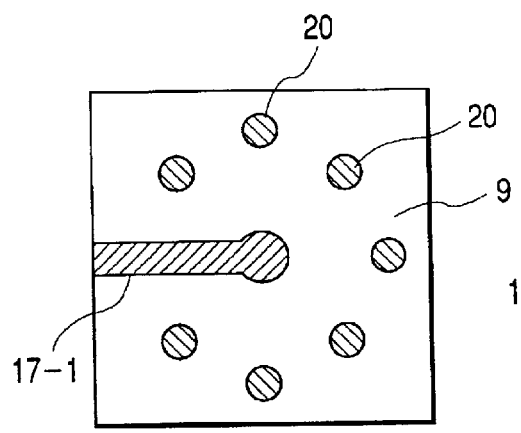
FIG. 4 is a diagram for explaining a third embodiment of a millimeter wave transmission line extending vertically to a layer in a multilayer dielectric substrate.
Figure 4B:
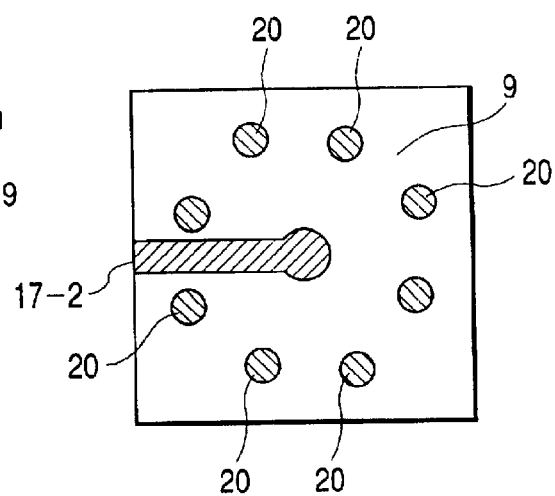

Reference numeral 20 denotes a group of vias connecting the grounding metallic layers 9 and 11. The via group 20 is disposed so that the interval of neighboring vias is equal to the cycle which is equal to or smaller than ¼ of the wavelength λ of a transmission signal. By surrounding a via 20c forming the center conductor with the via group 20, the via group 20 functions as an electromagnetic wave wall to confine the electromagnetic wave propagating in parallel between the metallic layers 9 and 10 and between the metallic layers 10 and 11. Therefore, a low transmission loss which is almost equal to that in the vertical transmission line shown in FIGS. 2A and 2B is achieved. Although the case where the vias of the via group 20 are distributed in a square shape has been described in the example of FIGS. 3A, 3B, and 3C, the vias can be distributed in a polygon shape having four or more sides such as a quadrangle or in a circular shape as shown in FIGS. 4A and 4B.

Figure 5:
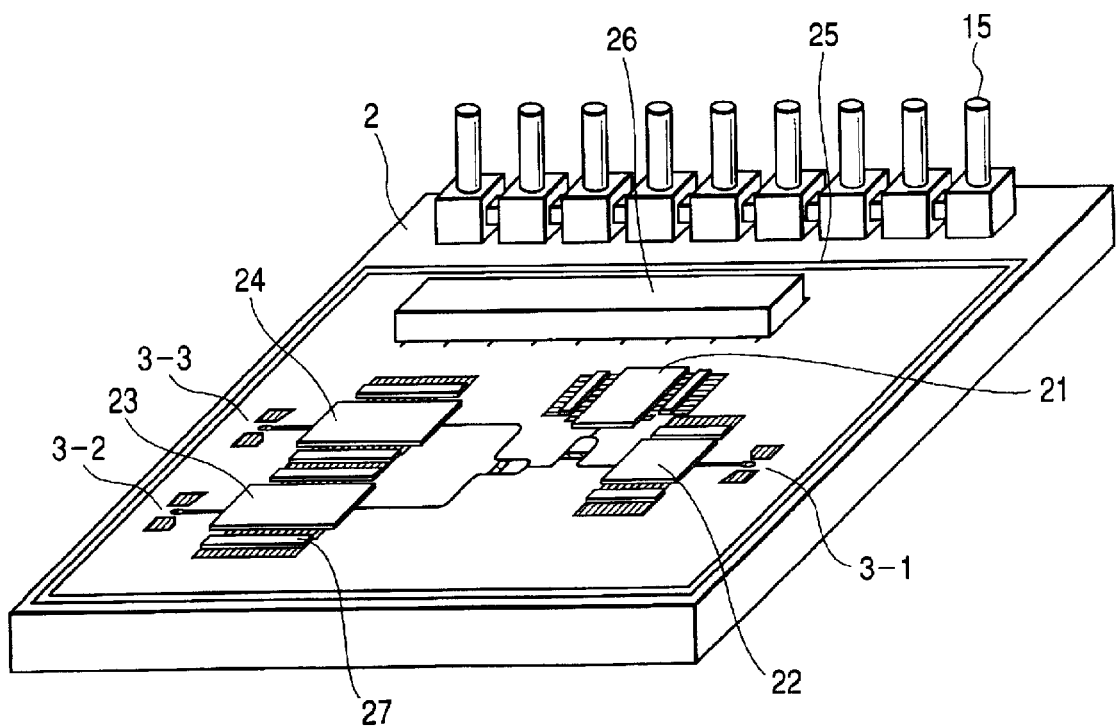
FIG. 5 is a perspective view showing an example of an automotive radar module according to the invention.

FIG. 5 is a perspective view of the RF circuit module of FIG. 1 with the hermetic cap 4 taken away. On the multilayer dielectric substrate 2, RF circuit parts such as an MMIC 21 of an oscillator, an MMIC 22 of a power amplifier, MMICs 23 and 24 of a receiver, input/output connector 15, a sealing pattern 25 for airtight sealing, millimeter wave vertical transmission lines 3-1, 3-2, and 3-3, a mono layer capacitor 27, and a chip part 26 are mounted. The RF circuit parts construct a transmission/reception circuit of a millimeter wave radar shown in FIG. 6. The millimeter wave vertical transmission lines 3-1, 3-2, and 3-3 are constructed by the coaxial line 19 in FIG. 2 or the via group 20 in FIG. 3 and connected to the antenna (not shown) on the rear face.

Figure 6:
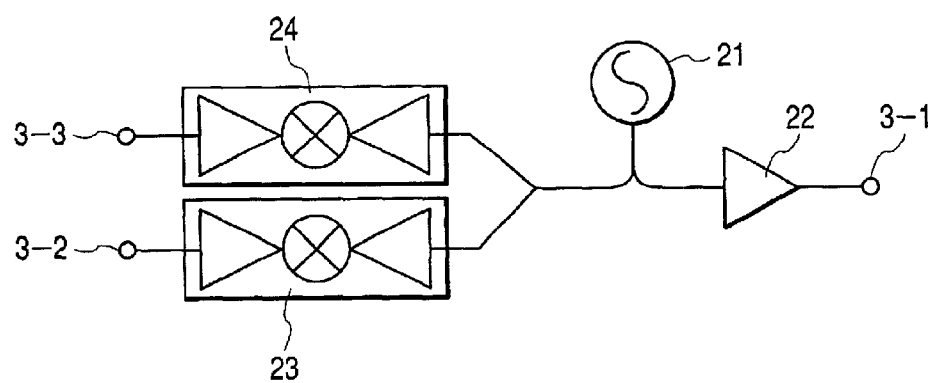
FIG. 6 is a block diagram showing the configuration of a transmission/reception circuit of a millimeter wave radar.

FIG. 6 is a block diagram showing the configuration of the transmission/reception circuit of the millimeter wave radar. In FIG. 6, to facilitate correspondence with the RF circuit parts of FIG. 5, the blocks are designated by the same numbers as those of the MMICs in FIG. 5. Reference numeral 22 denotes the MMIC for the power amplifier, 23 and 24 denote the MMICs for receiver, and 3-1, 3-2, and 3-3 are the millimeter wave vertical transmission lines. A millimeter wave signal generated by the oscillator 21 is distributed to the power amplifier 22 and receivers 23 and 24. The signal amplified by the power amplifier 22 is output to the millimeter wave vertical transmission line 3-1 so as to be transmitted to the transmission antenna. The millimeter wave reception signal subjected to Doppler shift by the vertical transmission lines 3-2 and 3-3 are applied to the receivers 23 and 24. In each of the receivers 23 and 24, the received millimeter wave signal and a signal as a local signal from the oscillator 21 are mixed with each other to obtain an intermediate frequency signal.

Referring again to FIG. 5, the MMICs 21 to 24 are mounted by bare chip bonding, flip chip bonding, or reflow with a liver. Since the multilayer dielectric substrate 2 is one-sided substrate, a connector, a mono layer capacitor, and a chip part can be mounted by an automatic mounter and subjected to a reflow process in a lump. To carry out the operations, it is important that the multilayer dielectric substrate 2 has a flat face irrespective of the small outer shape. In the case of die-bonding the MMIC, although it is after forming bonding wires, the RF circuit parts can operate in the state of FIG. 5. Consequently, a function test can be easily carried out. If there is a failure part, it can be easily replaced by performing reflow again. After conducting the function test of the RF circuit parts, the hermetic cap is attached and the hermetic process is performed, thereby finishing the assembly of the millimeter wave circuit parts. Therefore, the price can be largely reduced also in the millimeter wave radar module like the method of mounting a silicon semiconductor module. The sealing pattern 25 is metal plated so as to be easily bonded to the hermetic cap 4 by eutectic solder, silver paste, or the like. By surrounding the millimeter wave RF circuits with the cap 4 and the grounding metallic layer 25, the structure does not leak the millimeter wave signals to the outside except for the millimeter wave vertical transmission line 3.

In the RF circuit module, by providing five metallic layers in the hard multilayer dielectric substrate 2, the metallic pattern 17-1 on the top face of the dielectric substrate 2-1, the metallic layer 10 for a DC/IF signal as an internal layer, the grounding metallic layers 9 and 11 to shield the DC/IF signal on and under the layer 10, and the metallic pattern 1 for the antenna on the rear face can be formed at once, so that the cost of parts and assembling cost of RF circuit module can be reduced. By employing the multilayer structure, resistance to a mechanical stress moment can be improved. In the case where the dielectric of one layer in the multilayer substrate 2 is unignorably thick as compared with the wavelength, if a high frequency signal is transmitted vertically in the multilayer substrate, due to different potentials of the metallic layers in the multilayer substrate, each time the signal passes through the metallic layers, an electromagnetic wave which propagates parallel to the face of the metallic layer is generated. In the embodiment, however, by the vertical transmission line 16, the electromagnetic wave wall 18 having the coaxial structure or the periodical structure which suppresses the electromagnetic wave in the transverse direction can be formed.

According to the embodiment, the intermediate frequency signal and the power to be supplied to each of the MMICs are supplied from the outside via the input/output terminal pattern. All of the low frequency signals are transferred via the metallic layer 10 shielded by the grounding metallic layers 9 and 11 and are spatially shielded from the RF circuit parts. Thus, the millimeter wave signal transferred via the metallic layer 10 are not mixed as crosstalk.

By separately providing the transmission line for RF circuits and the signal lines for IF signals and power in each of the layers of the multilayer substrate, the transmission lines are not crossed each other, so that bonding wires for performing cubic line arrangement can be reduced. Thus, the millimeter wave transmission line can be linearly formed without being unnecessarily routed, and the area occupied by the RF circuits can be reduced. Consequently, reduction in the cost by designing the whole size of the multilayer dielectric substrate to be smaller and increase in the substrate life because of improvement in resistance to destruction by the mechanical stress moment are achieved.

All signals to be transmitted/received to/from the outside are connected via the metallic layer 10 and the pattern for the input/output terminal. Consequently, there is no electric line crossing the sealing pattern 25. Since the structure of a contact portion of the hermetic cap 4 and the multilayer dielectric substrate is a simple flat face, an increase in the cost of the cap 4 and the parts of the multilayer substrate can be minimized and the airtight life is also improved.

Figure 7:
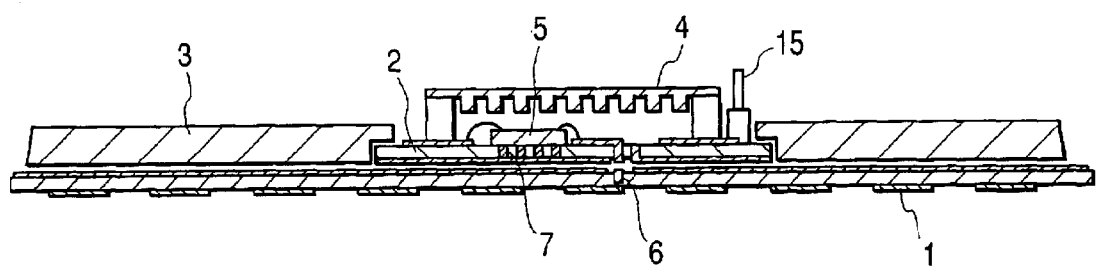
FIG. 7 is a sectional side view of another example of the automotive radar module according to the invention.

FIG. 7 is a sectional side view of another example of an automotive radar module according to the invention.

In the diagram, the configurations of the millimeter wave circuit part 5, hard multilayer substrate 2, hermetic cap 4, and millimeter wave transmission line 6 are substantially the same as those of the example of the RF circuit module.

Since the plane shape of the plane antenna 1 is larger than the area of the RF circuit module (hard multilayer substrate 2), a support plate 3 for assuring the mechanical strength of the antenna is disposed in the peripheral portion of the RF circuit module. Further, in order to efficiently dissipate the heat of the millimeter wave MMIC 5 to the hard multilayer substrate 2, a thermal via 7 is formed so that the heat is dissipated to the antenna 1 and the support plate 3.

For the antenna 1, a double-sided two-layer substrate having permittivity of 5 or less made of teflon or the like is used to suppress a radiation loss of the millimeter wave transmission line. The length of one of the sides of the hard multilayer dielectric substrate 2 is 5 cm or less, and the thickness of the substrate 2 is 0.5 mm or more so as to be resistant to a mechanical stress such as torsion or warp. The thickness of the dielectric of one layer in the multilayer substrate is 150 $\mu$m or less and a ceramic material such as glass ceramic or alumina ceramic is used. The millimeter wave MMIC 5 is mounted on the surface of the hard multilayer dielectric substrate 2, and the antenna 1 is adhered to the rear face of the hard multilayer dielectric substrate 2 so as to transmit/receive the millimeter wave signal to/from the antenna 1 via the millimeter wave transmission line 16 using the via.

The support plate 3 is attached to the antenna 1, thereby producing effects of reinforcement of the mechanical strength of the antenna 1 and the function of a heat dissipator for dissipating heat in the hard multilayer dielectric substrate. Particularly, when thermal conductivity is important, a metal plate is used. To increase the radiation effect, holes of a honey comb structure are opened to enlarge the surface area and the weight of the support plate 3 can be also reduced. To reduce the cost, a press member obtained by pressing a steel plate having both the honey comb structure and an H-letter cross section and having a thickness of 1 mm or less can be also used. In the case of fabricating the support plate 3 by a hard plastic material or an organic substrate such as a glass epoxy substrate which is often used as an electronic substrate, an electronic circuit can be mounted on the support plate 3 and a circuit for processing an IF signal obtained from the hard multilayer dielectric substrate and a power circuit can be formed.

The automotive radar module of the embodiment has a structure such that the RF circuit module 2 is positioned to the antenna 1 and mounted and, after that, the support plate 3 is adhered so as to surround the RF circuit module. By using the hard multilayer substrate 2, the mechanical strength of the RF circuit module is improved. By adding the support plate 3, the mechanical strength of the antenna 1 is maintained. In the RF circuit module, the millimeter wave high frequency signal transmission line is disposed on the surface and the power providing line and the low frequency signal transmission line are disposed in the intermediate layers of the grounding layers, thereby reducing crosstalk of the millimeter wave signal and realizing the multilayer wiring. Consequently, the flexibility of the wiring layout design increases, the occupied area can be reduced, and a smaller and cheaper RF circuit module can be fabricated. The millimeter wave signal of the millimeter wave radar is transmitted via the transmission line using a through via having the periodical structure or a through via having the coaxial structure to the rear face of the RF circuit module 2, and the power providing line and the low frequency signal transmission line are routed again to the surface of the RF circuit module 2 via the intermediate layers of the grounding layers. Thus, the cap 4 used for achieving the hermetic structure does not cross the signal lines, and the sealing can be safely achieved.

Figure 8:
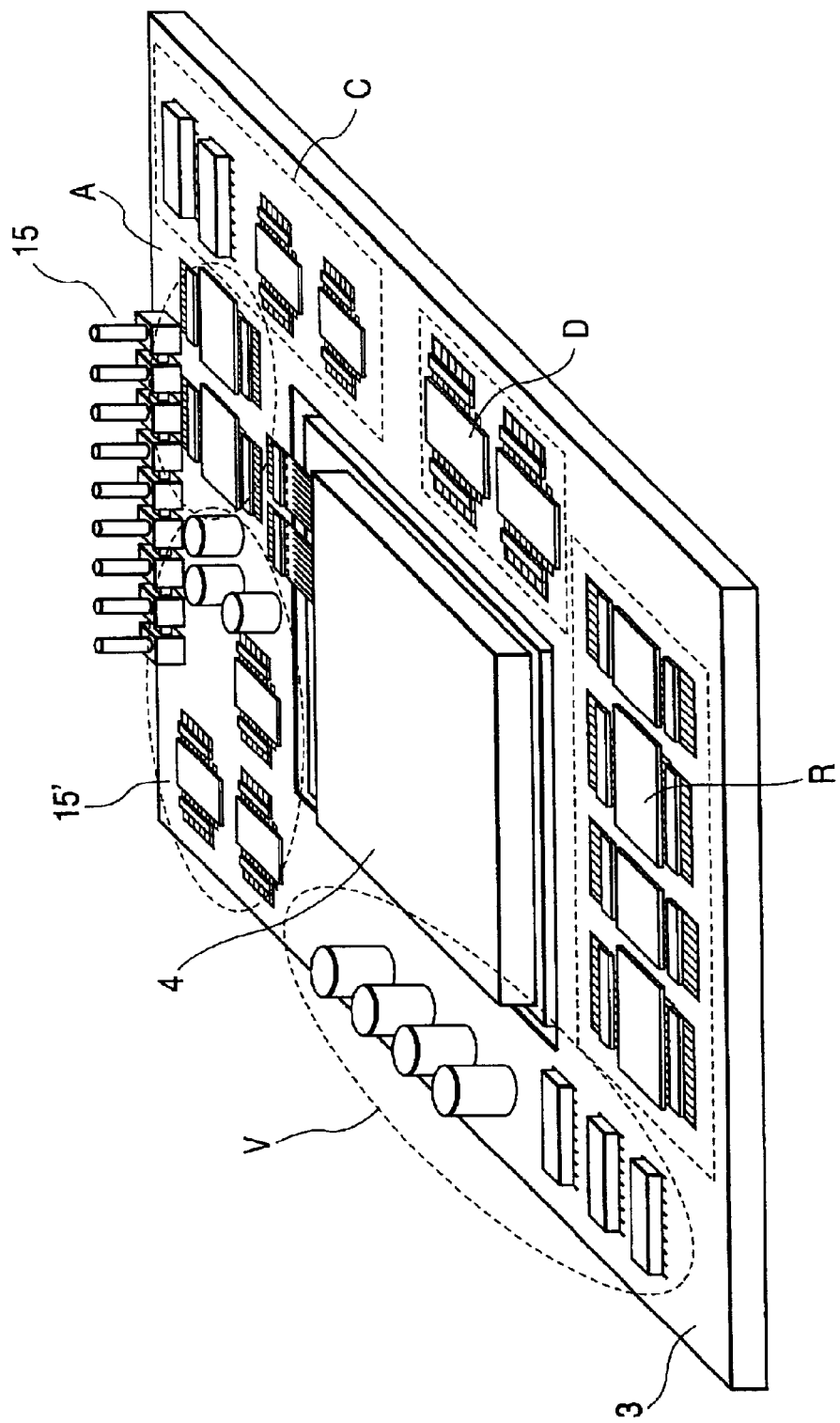
FIG. 8 is a perspective view of another example of the automotive radar module according to the invention.
Figure 9:
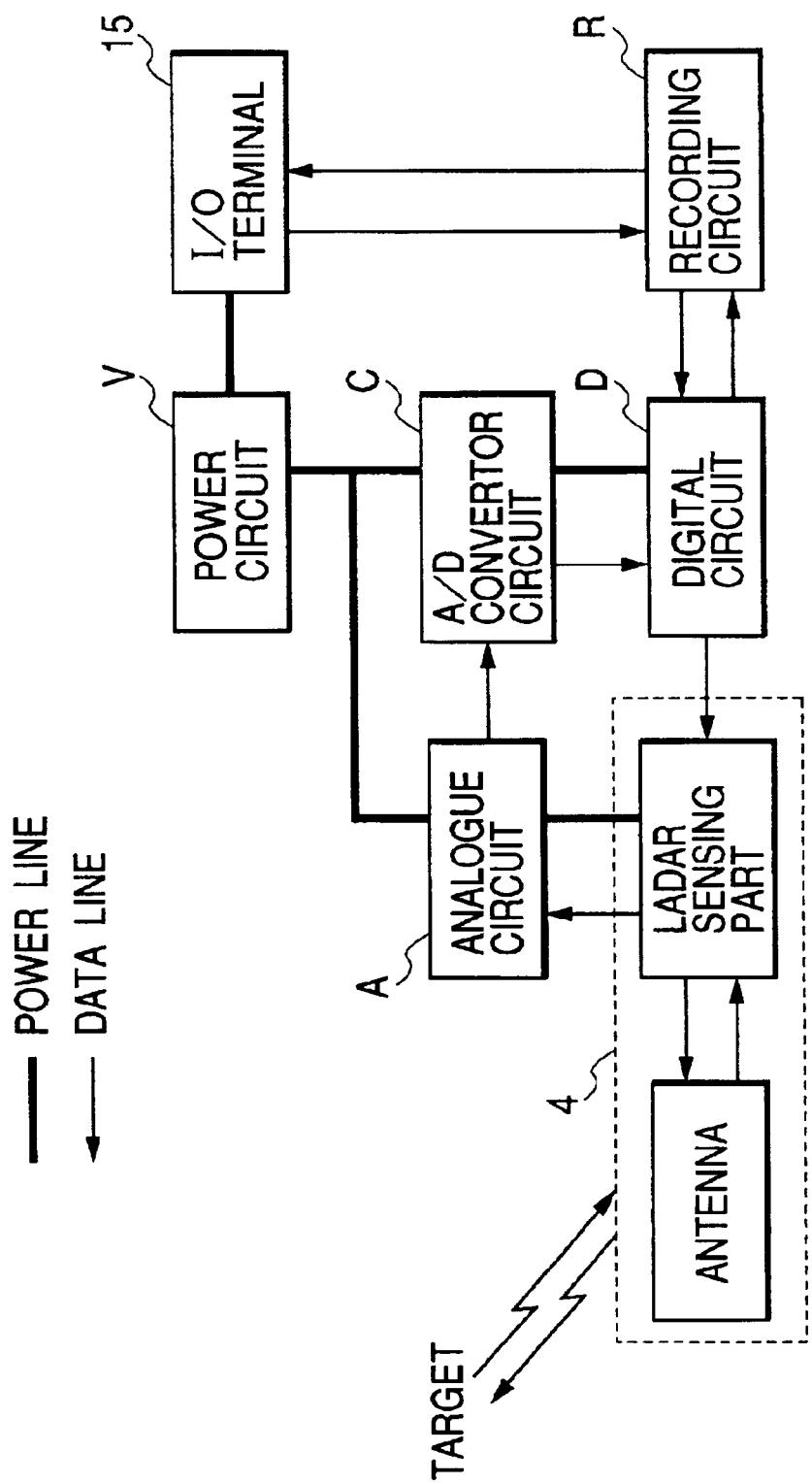
FIG. 9 is a block diagram showing the circuit configuration of the radar module of FIG. 8.
Figure 10:
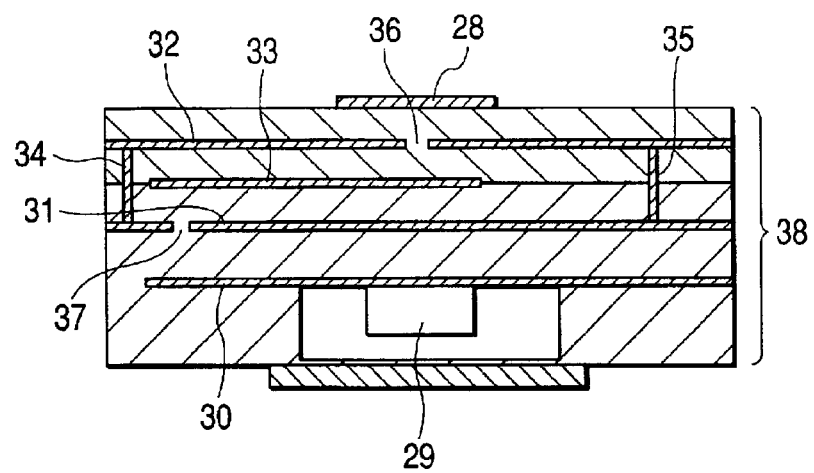
FIG. 10 is a cross section of a conventional high frequency package (1).
Figure 12:
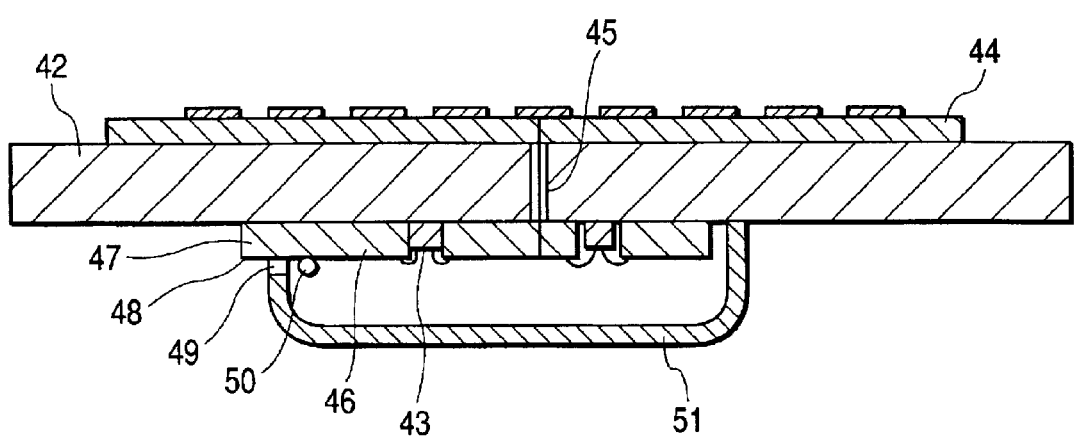
FIG. 12 is a cross section of a conventional high frequency transmission/reception module (3).
Figure 11A:
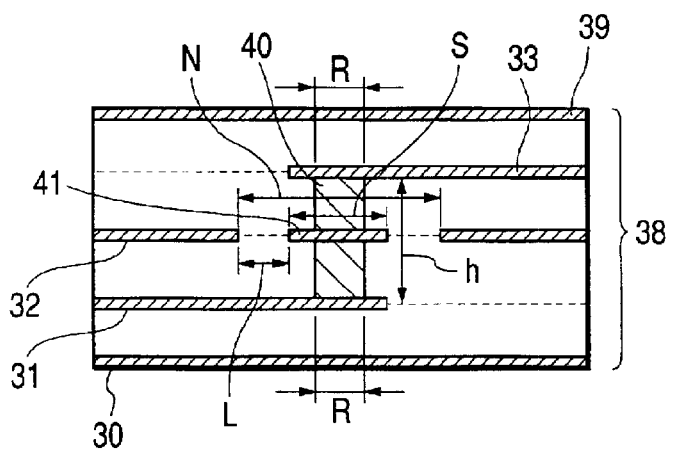
FIG. 11 is a diagram showing the configuration of a conventional high frequency package (2).
Figure 11B:
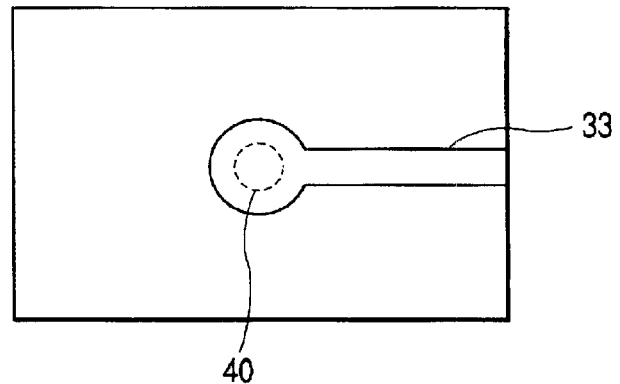
Figure 11C:
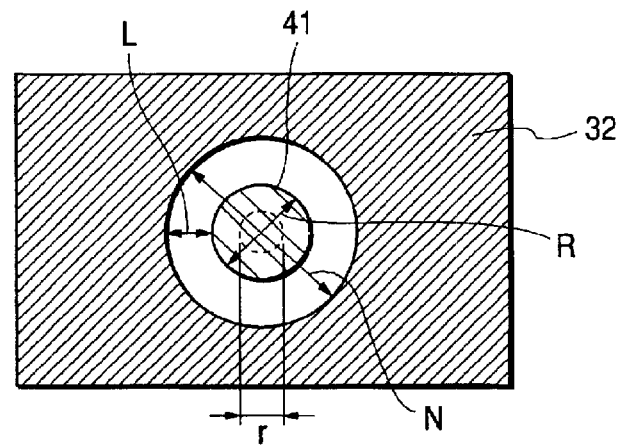

FIG. 8 is a sectional side view of another example of the automotive radar module according to the invention. In the embodiment, parts of a signal processing circuit (baseband signal processing circuit) other than the RF circuit module are additionally mounted on the top face (on the side opposite to the antenna conductive pattern 1) of the support plate 3 of the example shown in FIG. 7. The configuration of the baseband signal processing circuit is a conventionally known one. As shown in FIG. 9, the module includes: an analog circuit A for processing an IF signal from an RF circuit module 4, an A/D converting circuit C for converting an output of the analog circuit A into a digital signal, a digital circuit D for processing an output of the A/D converting circuit C and supplying a control signal to the RF circuit, a recording circuit R for transmitting/receiving data to/from the digital circuit D, an input/output terminal 15 for controlling the recording circuit R, a circuit 15' as a data generating unit interposed between the input/output terminal 15 and the recording circuit R, for generating data according to a request of another electronic device on the basis of information of the recording circuit R, and a power circuit V for supplying power to the parts. In FIG. 8, the same parts corresponding to the circuit parts of FIG. 9 are designated by the same reference numerals. Although lines connecting the parts are formed on the top face of the support plate 3, they are not shown for simplicity of the drawing.

What is claimed is:

1. A high frequency circuit module,
   wherein RF circuit parts are mounted on both sides of a multilayer dielectric substrate, transmission lines connecting said RF circuit parts on both sides are constructed by a group of vias having a periodical structure or vias having a coaxial structure extended in a direction perpendicular to the face of said multilayer dielectric substrate, a plurality of grounding conductive layers provided in said multilayer dielectric substrate, and said group of vias having the periodical structure is constructed so that a plurality of vias are distributed around a center conductor at an interval which is equal to or smaller than ¼ of wavelength of a signal of said transmission line, and end portions of said vias are connected with one of grounding conductive layers forming a microstrip transmission line and the one of grounding conductive layer has a circular radial gap being smaller than ¼ of the wavelength of a high frequency signal transmitted through the transmission line between an inner land connected to said center conductor and said grounding conductive layer.

2. The high frequency circuit module according to claim 1, wherein the RF parts provided on one face of said second dielectric substrate is an antenna.

3. A high frequency circuit module comprising:
   a multilayer dielectric substrate having a first and a second dielectric substrates each of which has RF circuit parts mounted on one side thereof, and at least one third dielectric substrate provided between the first and second dielectric substrates, and
   a transmission line constructed by a via having a coaxial structure connecting said RF circuit parts of the first and second dielectric substrates in a direction perpendicular to the face of said multilayer dielectric substrate,
   wherein said via having a coaxial structure is formed by a center conductor and a cylindrical conductor surrounding said center conductor and connected to a plurality of grounding conductive layers provided in said multilayer dielectric substrate, grounding conductive layers is connected to both sides of the cylindrical conductor and has a circular radial gap from an inner land connected to said center conductor, and said circular radial gaps being smaller than ¼ of a wavelength of a high frequency signal to be transmitted through the transmission line between a inner land connected to said center conductor and said grounding conductive layers connected to both sides of the cylindrical conductor.

4. The high frequency circuit module according to claim 3, wherein one of the RF circuit provided on one faces of said second dielectric substrate is an antenna.

5. The high frequency circuit module according to claim 4, wherein said second dielectric substrate is made of a both-sided two-layered dielectric substrate having permittivity being lower than permittivity of a fourth dielectric substrate and having a size larger than said fourth dielectric substrate, and a support plate is formed in the portion where said fourth dielectric substrates is not stacked on a face of the second dielectric substrate opposite to the face provided with the antenna.

6. The high frequency circuit module according to claim 3, wherein the microstrip transmission line of a millimeter wave circuit part is formed by the first dielectric substrate, a pattern of a metallic layer on one surface of the first dielectric substrate and a metallic layer provided between the first dielectric substrate and said third dielectric substrate, and a transmission line transmitting a low frequency signal and power is formed by another metallic layer provided in the multilayer dielectric substrate.

7. The high frequency circuit module according to claim 6, wherein a hermetic cap is mounted on a sealing pattern formed on the surface of said first dielectric substrate to cover the high frequency circuit parts.

8. An automotive radar module,
   wherein an antenna metallic pattern is formed on one of faces of a multilayer dielectric substrate,
   RF circuit parts including an oscillation circuit, a power amplifier for amplifying a part of an output of said oscillation circuit and supplying the amplified output to said antenna, and a mixer for mixing a signal from said antenna metallic pattern with a signal of the oscillation circuit are formed on the other face of said multilayer dielectric substrate, and
   a transmission line for connecting said antenna metallic pattern and said RF circuit parts is constructed by a coaxial structure transmission line having a center conductor and a cylindrical conductor or a group of vias surrounding said center conductor provided in the direction perpendicular to faces of said multilayer dielectric substrate, and an end portion of said coaxial structure transmission line is connected with one of grounding conductive layer forming microstrin transmission line and having a circular radial gaps being smaller than ¼ of the wavelength of high frequency signal be transmitted through the transmission line between said center conductor and said grounding conductive layer forming microstripline.

9. The automotive radar module according to claim 8, wherein the group of vias including said periodical structure is constructed so that the vias are distributed around a center conductor at an interval which is equal to or smaller than ¼ of a wavelength of a signal of said transmission line.

* * * * *